United States Patent [19]
Imai

[11] Patent Number: 6,125,288
[45] Date of Patent: Sep. 26, 2000

[54] TELECOMMUNICATION APPARATUS CAPABLE OF CONTROLLING AUDIO OUTPUT LEVEL IN RESPONSE TO A BACKGROUND NOISE

[75] Inventor: Yukihiro Imai, Yokohama, Japan

[73] Assignee: Ricoh Company, Ltd., Tokyo, Japan

[21] Appl. No.: 08/815,571

[22] Filed: Mar. 12, 1997

[30] Foreign Application Priority Data

Mar. 14, 1996 [JP] Japan .................................. 8-057316

[51] Int. Cl.$^7$ ...................................................... H04B 1/38
[52] U.S. Cl. ........................ 455/569; 455/67.3; 379/389; 381/94.1
[58] Field of Search ..................................... 455/569, 570, 455/67.3, 226.3, 222; 381/57, 107, 108, 94.1, 94.3, 225; 704/227, 222, 223, 225, 226, 233; 379/389, 420; 327/63, 91, 94, 97, 361

[56] References Cited

U.S. PATENT DOCUMENTS

| | | | |
|---|---|---|---|
| 3,832,493 | 8/1974 | Clark | 704/230 |
| 4,052,568 | 10/1977 | Jankowski | 704/233 |
| 4,052,678 | 10/1977 | Ramsland | 330/281 |
| 4,221,928 | 9/1980 | Franssen et al. | 381/11 |
| 4,277,645 | 7/1981 | May, Jr. | 704/233 |
| 4,829,565 | 5/1989 | Goldberg | 379/390 |
| 4,829,578 | 5/1989 | Roberts | 704/233 |
| 4,969,207 | 11/1990 | Sakamoto et al. | 455/134 |
| 5,007,046 | 4/1991 | Erving et al. | 370/249 |
| 5,111,191 | 5/1992 | Povenmire | 345/134 |
| 5,187,741 | 2/1993 | Erving et al. | 379/390 |
| 5,201,004 | 4/1993 | Fujiwara et al. | 704/233 |
| 5,208,866 | 5/1993 | Kato et al. | 381/107 |
| 5,297,198 | 3/1994 | Butani et al. | 379/389 |
| 5,432,859 | 7/1995 | Yang et al. | 381/94.3 |
| 5,485,515 | 1/1996 | Allen et al. | 379/391 |
| 5,526,419 | 6/1996 | Allen et al. | 379/389 |
| 5,615,256 | 3/1997 | Yamashita | 379/390 |
| 5,617,472 | 4/1997 | Yoshida et al. | 379/390 |
| 5,687,285 | 11/1997 | Katayanagi et al. | 704/226 |
| 5,732,390 | 3/1998 | Katayanagi et al. | 704/227 |
| 5,734,987 | 3/1998 | Shiono et al. | 455/570 |
| 5,793,863 | 8/1998 | Hashimoto | 379/387 |
| 5,796,847 | 8/1998 | Kaihotsu et al. | 381/57 |
| 5,818,267 | 10/1998 | Fujio et al. | 327/58 |
| 5,880,613 | 3/1999 | Ishihara | 327/202 |
| 5,955,903 | 9/1999 | Pham | 327/132 |
| 5,974,373 | 10/1999 | Chan et al. | 704/200 |

*Primary Examiner*—Reinhard J. Eisenzopf
*Assistant Examiner*—Charles N. Appiah
*Attorney, Agent, or Firm*—Cooper & Dunham LLP

[57] ABSTRACT

A method of detecting a noise level from audio signals produced consecutively in time by a microphone. The method includes the steps of evaluating an average level of the audio signals consecutively in time, and selecting the smallest of the average levels as the noise level. A telecommunication apparatus for adaptively controlling an audio output level in response to the noise level thus detected is also disclosed.

9 Claims, 6 Drawing Sheets

N→K CONVERSION

| N | K |
|---|---|
| SMALL → | SMALL |
| LARGE → | LARGE |

6,125,288

TELECOMMUNICATION APPARATUS CAPABLE OF CONTROLLING AUDIO OUTPUT LEVEL IN RESPONSE TO A BACKGROUND NOISE

BACKGROUND OF THE INVENTION

The present invention generally relates to telecommunication apparatuses and more particularly to a telecommunication apparatus such as a telephone apparatus, including a portable radio telephone apparatus, that is capable of controlling an audio output level adaptively in response to a noise level in the environment.

When using a telecommunication apparatus such as a telephone apparatus in a noisy environment, there are cases in which the audio output from the telephone apparatus is difficult to comprehend because of the noise. In order to deal with this problem, there are telephone apparatuses equipped with a manually operative switch such that the user can manually increase or decrease the audio output level of the telephone apparatus in accordance with the noise level of the environment. Further, there are proposals to achieve such a control of the audio output level of the telephone apparatus adaptively in response to the noise level of the environment.

For example, Japanese Laid-Open Utility Model Publication 5-6954 describes a telephone apparatus that carries out a measuring of the noise level in an interval where there is no speech. Thereby, the audio output level of the telephone apparatus is adjusted in response to the detected noise level.

However, the foregoing proposal cannot adapt to a change of the noise level that may occur during the speech, and the audio output level may not be optimum with regard to the real background noise level. Further, the foregoing proposal uses a separate microphone dedicated for the noise level detection, while use of such a separate microphone increases the cost of the telephone apparatus.

SUMMARY OF THE INVENTION

Accordingly, it is a general object of the present invention to provide a novel and useful telecommunication apparatus wherein the foregoing problems are eliminated.

Another and more specific object of the present invention is to provide a telecommunication apparatus capable of changing the audio output level thereof in response to a noise level of the environment in which the telephone apparatus is operated.

Another object of the present invention is to provide a telecommunication apparatus, comprising:

a microphone picking up a sound including a speech and a background noise, said microphone thereby producing audio input signals indicative of said sound consecutively in time;

a transmitter for transmitting said audio input signals in the form of an outgoing transmission signal;

a receiver for receiving an incoming transmission signal;

an audio level control circuit supplied with said incoming transmission signal for producing an audio output signal therefrom with a predetermined audio output level;

a loudspeaker for emitting said audio output signal in the form of a sound;

noise level detection means connected to said microphone for detecting a background noise level from said audio input signals produced by said microphone; and noise level control means supplied with said background noise level from said noise level detection means for setting said predetermined audio output level of said audio level control circuit;

said noise level detection means evaluating an average level of said audio input signals consecutively in time and selecting the smallest of said average levels as said background noise level.

Another object of the present invention is to provide a method of detecting a noise level from audio signals produced consecutively in time by a microphone, said method comprising the steps of:

evaluating an average level of said audio signals consecutively in time; and selecting the smallest of said average levels as said noise level.

Another object of the present invention is to provide a method of controlling an audio output of a telecommunication apparatus in response to a noise level of a site in which the telecommunication apparatus is used, comprising the steps of:

detecting the noise level from audio signals produced consecutively in time by a microphone, said method comprising the steps of evaluating an average level of said audio signals consecutively in time, and selecting the smallest of said average levels as data indicative of said noise level; and controlling an audio output of said telecommunication apparatus in response to said noise level such that said audio output is increased when said noise level is increased and such that said audio output is decreased when said noise level is decreased.

Another object of the present invention is to provide a computer-implemented method of detecting a noise level from audio signals produced consecutively in time by a microphone, said method comprising the steps of:

evaluating an average level of said audio signals consecutively in time; and selecting the smallest of said average levels as said noise level.

According to the present invention, the background noise level of the environment in which the telecommunication apparatus is operated is detected from the audio signal picked up by a microphone, which is used also for picking up the speech. Thereby, the construction of the telecommunication apparatus is simplified, and the audio output of the telecommunication apparatus can be changed adaptively in response to the change of the noise level without a manual intervention.

Other objects and further features of the present invention will become apparent from the following detailed description when read in conjunction with the attached drawings.

DETAILED DESCRIPTION OF THE PREFERRED EMBODIMENTS

Figure 1:
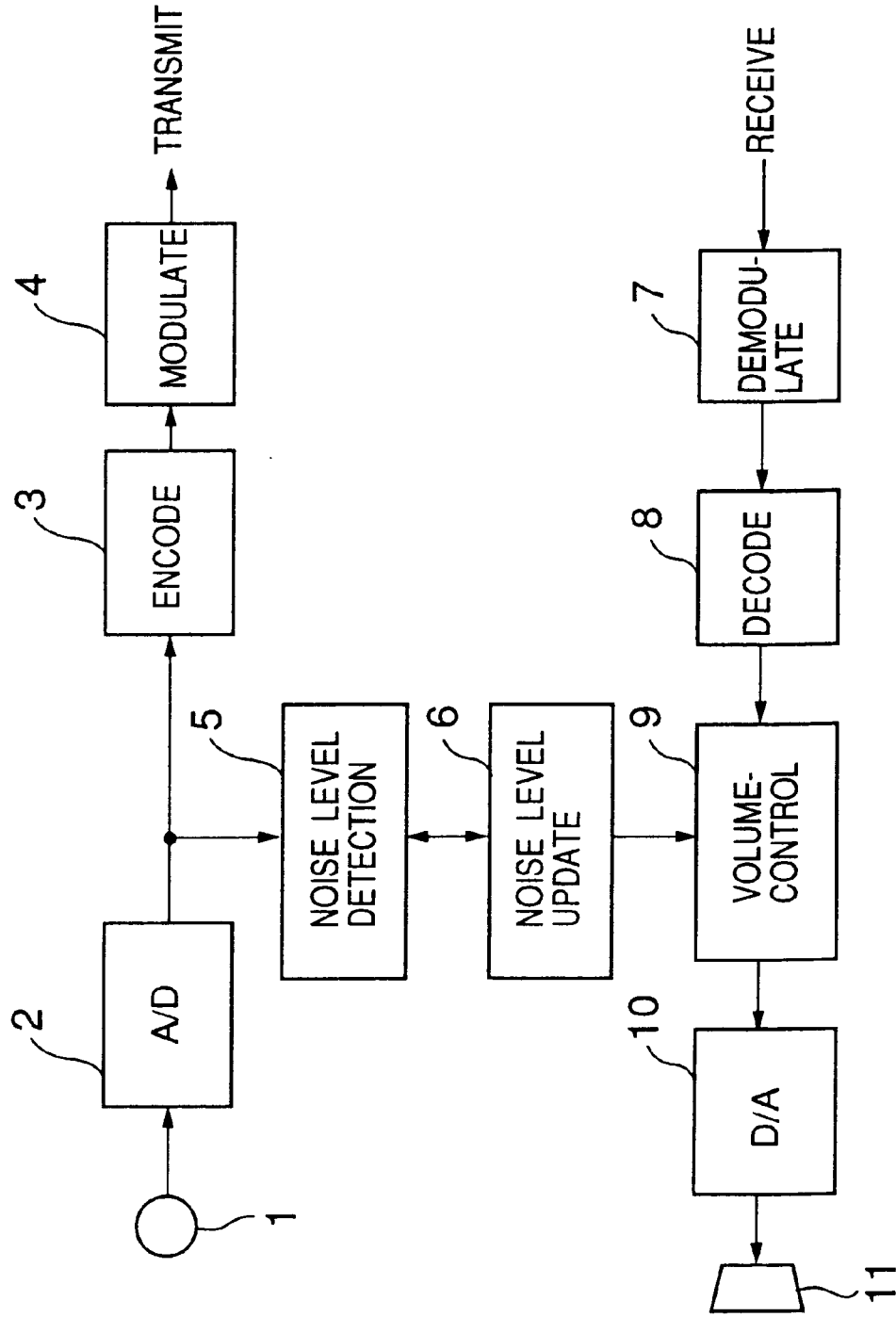
FIG. 1 is a block diagram showing a construction of a telecommunication apparatus according to a first embodiment of the present invention.

FIG. 1 shows the construction of a telecommunication apparatus according to a first embodiment of the present invention.

Referring to FIG. 1, the telecommunication apparatus includes a microphone 1 for picking up an audio signal and an A/D converter 2 for converting the picked-up audio signal into an outgoing digital audio signal. The outgoing digital audio signal thus produced is then encoded by an encoder 3, and a resultant outgoing audio signal is transmitted over a radio channel after a modulation by a modulator 4, in the form of an outgoing encoded digital transmission.

Further, an incoming transmission is demodulated by a demodulator 7 and decoded subsequently by a decoder 8 to produce an incoming digital audio signal. The incoming digital audio signal is then passed through a volume-control circuit 9 for a volume control and supplied subsequently to a D/A converter 10 for conversion to an audio signal. The audio signal thus produced is then emitted by a loudspeaker 11.

In order to allow an adaptive volume control in the volume-control circuit 9 in response to the noise level of the environment in which the telecommunication apparatus is operated, the present invention uses a noise level detection circuit 5 for separating and detecting the noise level from the audio signal picked up by the microphone 1. Thus, the noise level detection circuit 5 is connected to the A/D converter 2 for receiving the digital audio signal therefrom, and the noise level thus detected by the noise level detection circuit 5 is used in an updating circuit 6 for updating the value of a control signal that is used in the volume-control circuit 9 for the volume control, such that the audio output is increased when the detected noise level is increased and decreased when the detected noise level is decreased.

Figure 2:
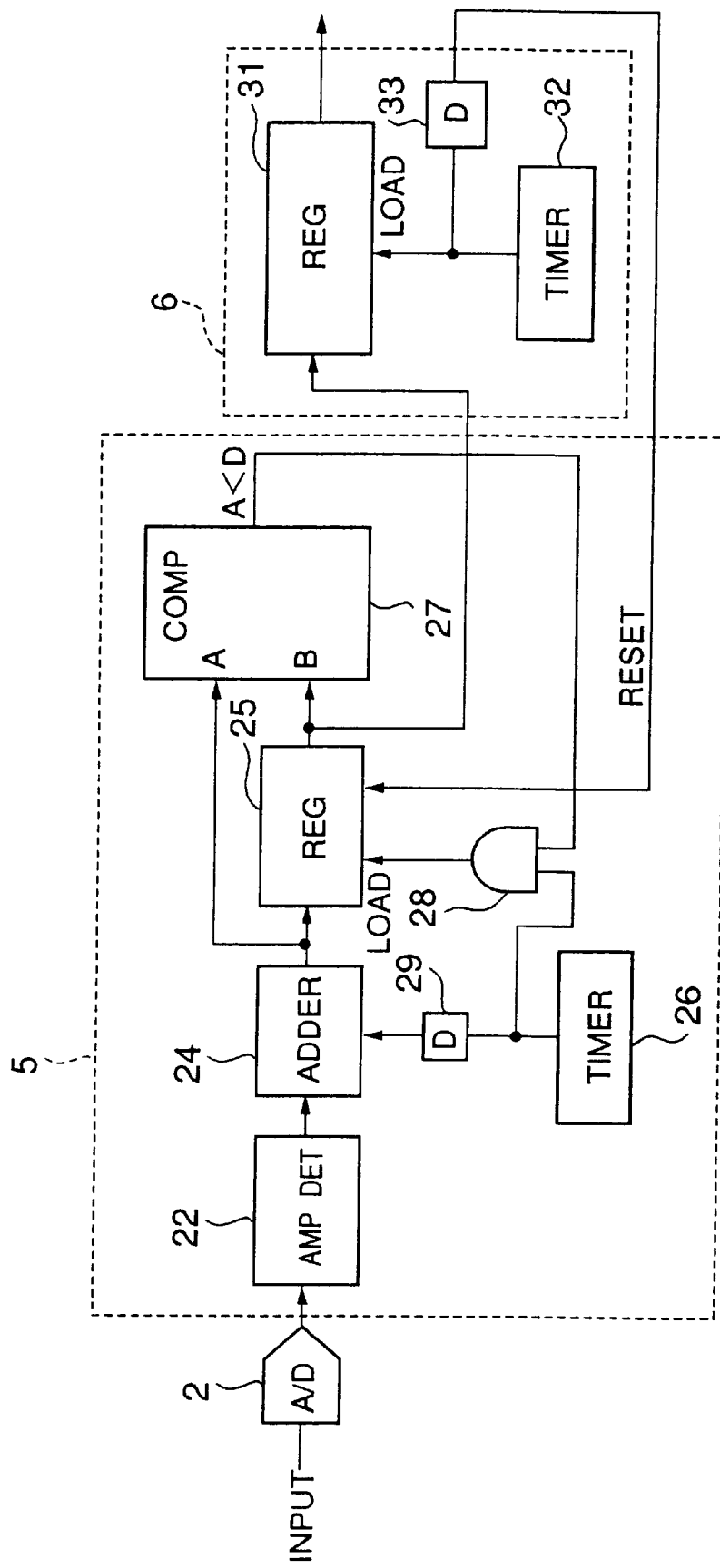
FIG. 2 is a block diagram showing a part of the telecommunication apparatus of FIG. 1 in detail.

FIG. 2 shows the construction of the noise level detection circuit 5 and the updating circuit 6.

Referring to FIG. 2, the outgoing digital audio signal of the A/D converter 2 is supplied to an amplitude detector 22 that detects the amplitude of the audio signal by detecting the absolute value of the digital audio signal. The detector 22 thereby produces an output in the form of digital amplitude data, and the digital amplitude data thus produced is supplied to an adder 24.

The adder 24 is reset periodically by a reset signal, which is supplied from a first timer 26 periodically with a predetermined time interval via a delay circuit 29, and produces data indicative of a sum of the digital amplitude data supplied thereto from the detector 22 for the foregoing predetermined time interval. This in turn means that the adder 24 produces an equivalent of an average of the amplitude data for the foregoing predetermined interval repeatedly.

The sum data produced by the adder 24 is then forwarded on the one hand to an input port A of a comparator 27 and on the other hand to an input port B of the same comparator 27 via a first register 25, wherein the sum data of the adder 24 is loaded into the register 25 in response to a timing signal produced by the first clock 26 and supplied to the register 25 via an AND gate 28.

The comparator 27 compares the data at the input port A and the output port B and produces an output logic signal indicating the result of the comparison. The comparator 27 produces a logic signal "High" in response to the condition that the data at the input port A is smaller than the data at the input port B (A<B), wherein the foregoing loading of the output of the adder 24 into the register 25 occurs only when the foregoing condition A<B is met. It should be noted that the output logic signal of the comparator 27 is supplied to the AND gate 28 for activating the same, and the timing signal of the timer 26 reaches the first register 25 through the AND gate 28 only when the output of the comparator 27 is in the "High" level state.

In the circuit of FIG. 2, therefore, it should be noted that the updating of the register 25 does not occur as long as the data at the input port A is equal to or larger than the data at the input port B (A≧B). This means that the first register 25 holds the minimum or the smallest of the sum data that has occurred ever since the start of operation of the register 25.

In the present invention, such a minimum of the average level held in the first register 25 is used as the quantity indicating the noise level of the environment, based upon the consideration that the audio signal picked up by the microphone 1 includes both a speech and background noise, while the audio signal level should inevitably become higher when the speech is superimposed on the background noise. When the detected audio signal level becomes reduced for a predetermined interval, this can be interpreted that the detected audio signal level indicates the background noise level.

After the loading of the new data to the register 25 from the adder 24 is thus completed, the adder 24 is reset with a predetermined time delay provided by the delay circuit 29.

The data held in the first register 25 is then supplied to a second register 31 forming the update control circuit 6, wherein the loading of the data to the register 31 is made in response to a timing signal produced by a second timer 32 with a much slower rate. Further, after the loading of the content of the register 25 to the register 31, the first register 25 is reset in response to the timing signal that is supplied from the timer 32 to the register 25 via a delay circuit 33. Thereby, the content of the resister 25 is transferred to the register 31 periodically, and the data thus held in the register 31 is used in the volume-control circuit 9 as noise level data N used as the control signal.

Figure 3:
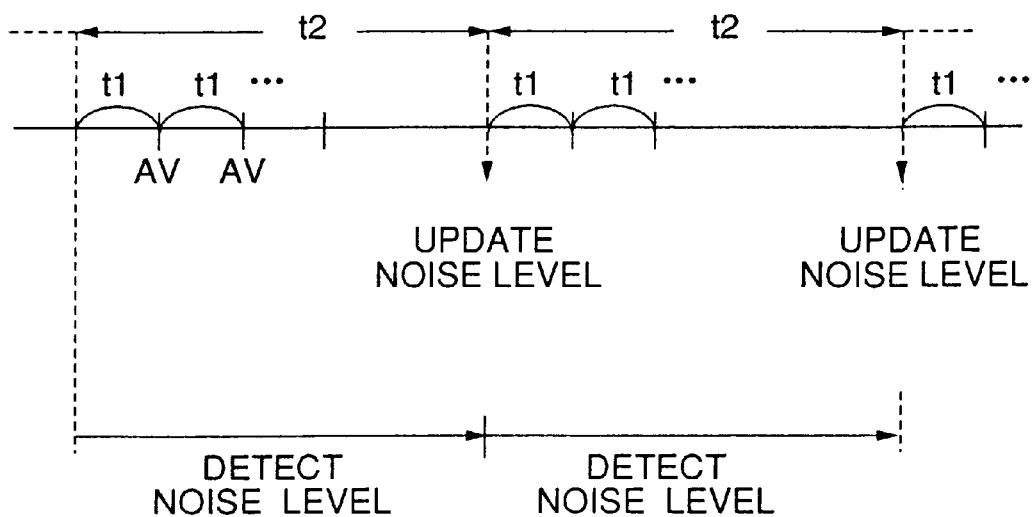
FIG. 3 is a diagram explaining the timing of operation of the circuit of FIG. 2.

FIG. 3 shows the timing of operation of the circuit of FIG. 2, in which it should be noted that the detection of the sum or average by the adder 24 is carried out periodically with every first interval $t_1$ in response to the clock produced by the first timer 26, while the update of the first register 25 and the transfer of the content of the first register 25 to the second register 31 occur with every second interval $t_2$ in response to the clock provided by the second timer 32.

Figures 4A, 4B:
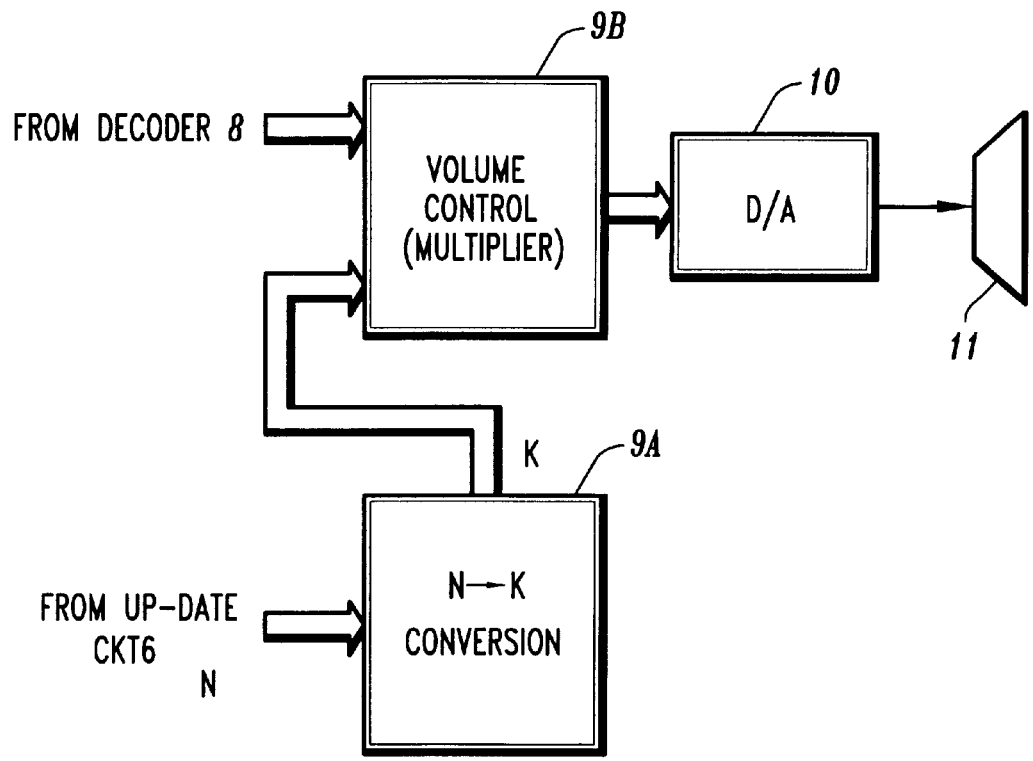
FIGS. 4A and 4B are diagrams showing a different part of the telecommunication apparatus of FIG. 1.

FIG. 4A shows the construction for the adaptive volume control achieved in the volume-control unit 9 in response to the noise level data N supplied from the update circuit 6.

Referring to FIG. 4A, the noise level data N is supplied to a data conversion unit 9A forming a part of the volume-control circuit 9, wherein the data N is converted to data K according to a relationship shown in FIG. 4B. The data K thus formed is then used in a volume-control unit 9B, which is actually a multiplier that multiplies the foregoing data K with the output digital audio signal supplied from the decoder 8. As indicated in FIG. 4B, the data conversion unit 9A produces the data or coefficient K such that the data K is small when the data N is small and such that the data K is large when the data K is large. It is also possible to use the data N itself as the data K.

As a result of the data conversion in the unit 9A, the volume control circuit 9 increases the output level of the output audio signal when the detected noise level N is large and decreases the output level of the output audio signal when the detected noise level N is small.

Next, a telecommunication apparatus according to a second embodiment of the present invention will be described with reference to FIG. 5.

Figure 5:
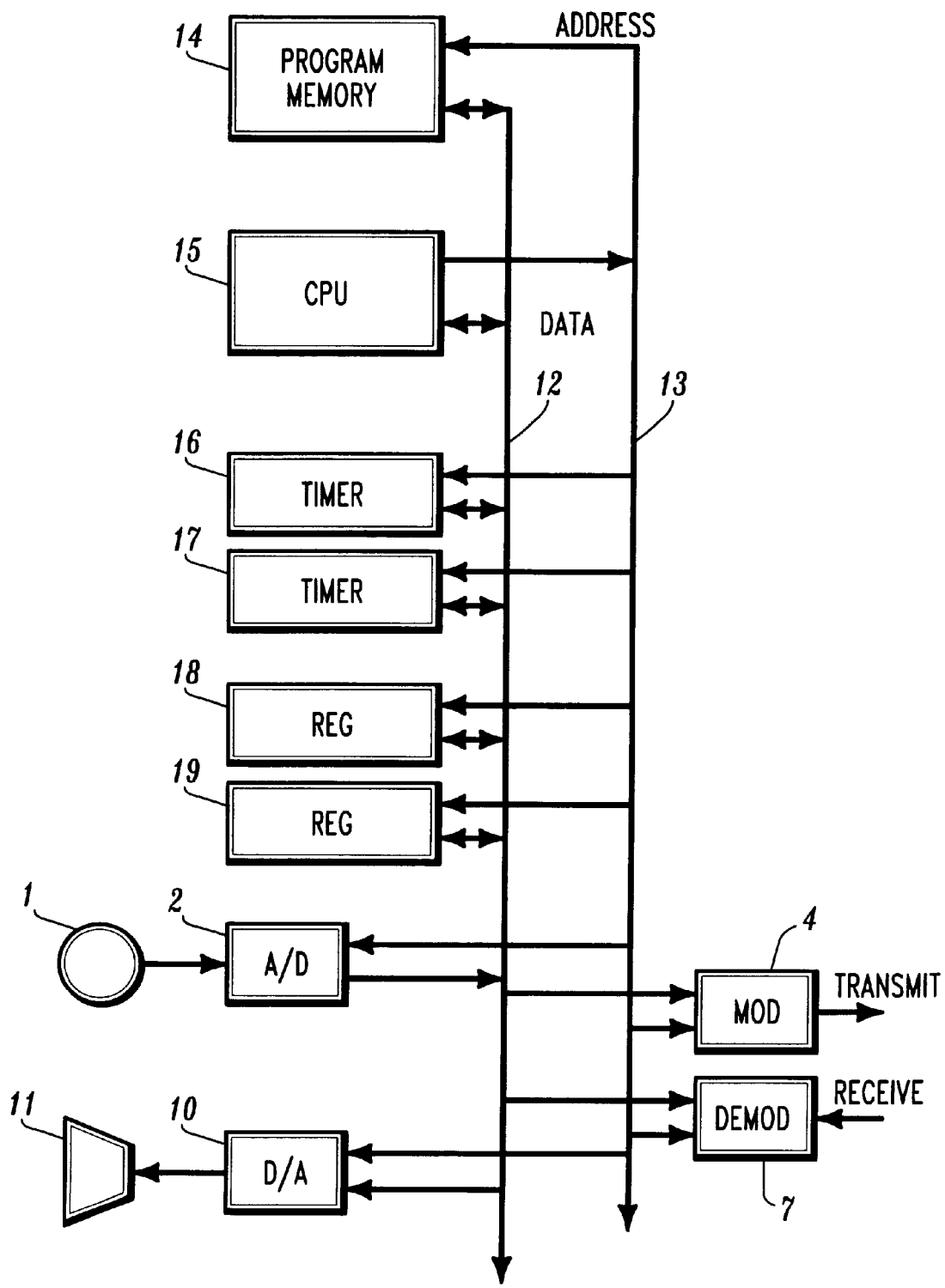
FIG. 5 is a diagram showing the construction of a telecommunication apparatus according to a second embodiment of the present invention.

Referring to FIG. 5, the telecommunication apparatus includes a data bus 12 and an address bus 13 to which a microprocessor 15 and a program memory 14 are connected. Further, a first timer 16 clocking at a first clock rate and a second timer 17 clocking at a second, slower rate, are connected to each of the data bus 12 and the address bus 13, wherein the timer 16 corresponds to the timer 26 while the timer 17 corresponds to the timer 32. Similarly, first and second registers 18 and 19 are connected to each of the data bus 12 and the address bus 13 in correspondence to the registers 25 and 31. Further, the A/D converter 2 of FIG. 1 is now connected to each of the data bus 12 and the address bus 13, and the D/A converter 10 also of FIG. 1 is now connected to each of the data bus 12 and the address bus 13. Thus, the audio signal picked up by the microphone 1 is supplied to the data bus 12 after an A/D conversion in the A/D converter 2. Similarly, the digital audio data on the data bus 12 is emitted from the loudspeaker 11 after a D/A conversion by the D/A converter 10. In addition, each of the modulator 4 and the demodulator 7 is connected to the data bus 12 and the address bus 13.

Figure 6:
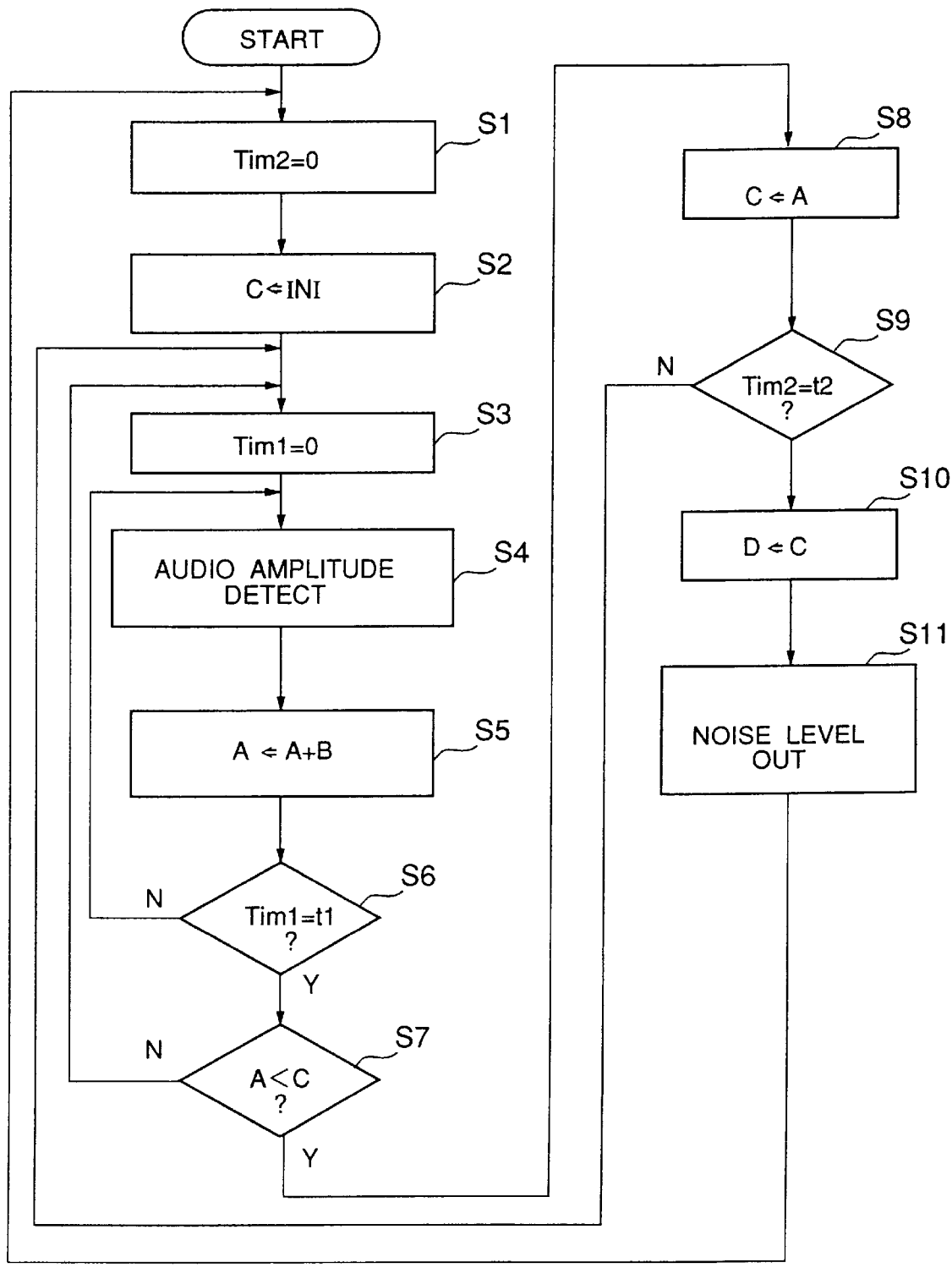
FIG. 6 is a flowchart showing the operation of the apparatus of FIG. 5.

In operation, the CPU 15 reads out the program stored in the program memory 14 and carries out the operation shown in the flowchart of FIG. 6.

Referring to FIG. 6, the process starts with a step S1 for starting the second timer 17, followed by a step S2 for initializing the first register 18 wherein arbitrary initial data INI is set into the register 18 as data C.

Next, in a step S3, the first timer 16 is started, and the detection of amplitude of the digital audio signal supplied from the A/D converter 2 to the data bus 12 is conducted. As a result of the amplitude detection, data B is obtained in the step S4, wherein a sum is taken for the data B in a step S5 to produce sum data A. Further, a step S6 is conducted for discriminating whether the predetermined time $t_1$ has elapsed, by checking the count of the timer 16 in a step S6, and the process returns to the step S4 when the time $t_1$ has not elapsed.

When the time $t_1$ has elapsed, on the other hand, a discrimination whether or not the sum A is smaller than the data C in the first register 18, is made in a step S7 by comparing the data A and the data C. If the result is NO, the process returns to the step S3 and the timer 16 is started. Further, the steps S4–S7 are repeated similarly as described above.

When the result of discrimination in the step S7 is YES, on the other hand, the sum data A is set in the first register 18 as the data C, and a step S9 is conducted for checking the timer 17 as to whether or not the predetermined time $t_2$ has elapsed since the last clearing of the timer 17. If the result of the discrimination is NO, the process returns to the step S3 and the steps S4–S8 are repeated similarly as described above. When the result is YES, on the other hand, the data C is set in the second register 19 in a step S10, and the data D is supplied to the process of volume control in which the data D is merely multiplied with the output digital audio data on the data bus 12 in a step S11.

After the step S11, the process returns to the step S1.

According to the process of FIG. 6, the minimum of the sum data A is held in the second register 19 as the data D, similarly to the second register 32 of FIG. 2, after a continuous operation of the system, and the data D thus obtained is used for the adaptive volume control carried out by the CPU 15 similarly to the volume-control unit 9 of FIG. 1. It should be noted that the sum data A is cleared periodically. Thus, the sum data A can be regarded as an equivalent of the average of the amplitude data.

In addition to the foregoing, the CPU 15 carries out the function of the encoder 3 and the decoder 8. Thus, the encoded data is produced on the data bus 12 in response to the encoding of the outgoing digital audio signal and is transmitted via the modulator 4 now connected to the data bus 12. Similarly, an incoming transmission is supplied to the data bus 12 by the demodulator 7 in the form of an incoming digital audio signal.

Further, the present invention is by no means limited to the embodiments described heretofore, but various variations and modifications may be made without departing from the scope of the invention.

What is claimed is:

1. A telecommunication apparatus, comprising:

a microphone for picking up a sound including speech and background noise, said microphone thereby producing audio input signals indicative of said sound consecutively in time;

a transmitter for transmitting said audio input signals in the form of an outgoing transmission signal;

a receiver for receiving an incoming transmission signal;

an audio level control circuit supplied with said incoming transmission signal for producing an audio output signal therefrom with a predetermined audio output level;

a loudspeaker for emitting said audio output signal in the form of a sound;

noise level detection means connected to said microphone for detecting a background noise level from said audio input signals produced by said microphone; and noise level control means supplied with said background noise level from said noise level detection means for setting said predetermined audio output level of said audio level control circuit, wherein said noise level detection means evaluates an average level of said audio input signals consecutively in time and selects the smallest of said average levels as said background noise level, and said noise level detection means includes an amplitude detector supplied with said audio input signals consecutively in time for detecting an amplitude thereof, said amplitude detector producing amplitude data indicative of said amplitude of said audio input signals consecutively in time, and an adder supplied with said amplitude data consecutively in time for summing up said amplitude data supplied thereto, said adder producing sum data indicative of the result of said summing and being cleared periodically with a constant first time interval, a first register holding said sum data of said amplitude data produced by said adder, wherein the sum data from said adder is loaded to said first register at predetermined time intervals only when said sum data from said adder is smaller than said sum data already held by said first resister.

2. A telecommunication apparatus, comprising:

a microphone for picking up a sound including speech and background noise, said microphone thereby producing audio input signals indicative of said sound consecutively in time;

a transmitter for transmitting said audio input signals in the form of an outgoing transmission signal;

a receiver for receiving an incoming transmission signal;

an audio level control circuit supplied with said incoming transmission signal for producing an audio output signal therefrom with a predetermined audio output level;

a loudspeaker for emitting said audio output signal in the form of a sound;

noise level detection means connected to said microphone for detecting a background noise level from said audio input signals produced by said microphone; and noise level control means supplied with said background noise level from said noise level detection means for setting said predetermined audio output level of said audio level control circuit, wherein said noise level detection means evaluates an average level of said audio input signals consecutively in time and selects the smallest of said average levels as said background noise level, and said noise level detection means includes an amplitude detector supplied with said audio input signals consecutively in time for detecting an amplitude thereof, said amplitude detector producing amplitude data indicative of said amplitude of said audio input signals consecutively in time, an adder supplied with said amplitude data consecutively in time for summing up said amplitude data supplied thereto, said adder producing sum data indicative of the result of said summing and being cleared periodically with a constant first time interval, a first register holding said sum data of said amplitude data produced by said adder, a comparator for carrying out a comparison for comparing said sum data as produced by said adder and said sum data held in said first register, said comparator producing a logic control signal indicative of a result of said comparison, and a first load enable gate supplied with said logic control signal from said comparator for enabling a loading of said sum data from said adder to said first register only when said sum data as supplied from said adder is smaller than said sum data held in said first register.

3. A telecommunication apparatus, comprising:

a microphone for picking up a sound including speech and background noise, said microphone thereby producing audio input signals indicative of said sound consecutively in time;

a transmitter for transmitting said audio input signals in the form of an outgoing transmission signal;

a receiver for receiving an incoming transmission signal;

an audio level control circuit supplied with said incoming transmission signal for producing an audio output signal therefrom with a predetermined audio output level;

a loudspeaker for emitting said audio output signal in the form of a sound;

noise level detection means connected to said microphone for detecting a background noise level from said audio input signals produced by said microphone; and noise level control means supplied with said background noise level from said noise level detection means for setting said predetermined audio output level of said audio level control circuit, wherein said noise level detection means evaluates an average level of said audio input signals consecutively in time and selects the smallest of said average levels as said background noise level, said noise level detection means includes an amplitude detector supplied with said audio input signals consecutively in time for detecting an amplitude thereof, said amplitude detector producing amplitude data indicative of said amplitude of said audio input signals consecutively in time, an adder supplied with said amplitude data consecutively in time for summing up said amplitude data supplied thereto, said adder producing sum data indicative of the result of said summing and being cleared periodically with a constant first time interval, a first register holding said sum data of said amplitude data produced by said adder, a comparator for carrying out a comparison for comparing said sum data as produced by said adder and said sum data held in said first register, said comparator producing a logic control signal indicative of a result of said comparison, and a first load enable gate supplied with said logic control signal from said comparator for enabling a loading of said sum data from said adder to said first register only when said sum data as supplied from said adder is smaller than said sum data held in said first register, and said noise level control means includes a second register holding said sum data in said first register and a second load enable gate enabling a loading of said sum data from said first register to said second register with a constant second time interval larger than said first time interval.

4. A method of detecting a noise level from audio signals produced consecutively in time by a microphone, said method comprising the steps of:

evaluating an average level of said audio signals consecutively in time; and selecting the smallest of said average levels as said noise level, wherein said step of evaluating said average level includes the steps of detecting an amplitude of said audio signals consecutively in time, summing data indicative of said amplitude in an adder for a predetermined time interval, and clearing said adder in each said predetermined time interval, and wherein said step of selecting the smallest of said average levels as said noise level includes a step of latching an output of said adder at predetermined time intervals only when said output of said adder is smaller than data already latched.

5. A method of detecting a noise level from audio signals produced consecutively in time by a microphone, said method comprising the steps of:

evaluating an average level of said audio signals consecutively in time; and selecting the smallest of said average levels as said noise level, wherein said step of evaluating said average level includes the steps of detecting an amplitude of said audio signals consecutively in time, summing data indicative of said amplitude in an adder for a predetermined time interval and clearing said adder in each said predetermined time interval, and said step of selecting the smallest of said average levels includes the steps of comparing said average levels consecutively in time with reference level data, wherein, in each of said steps of comparing said average levels, average level data is substituted for said reference level data when said average level data is smaller than said reference level data.

6. A method of controlling an audio output of a telecommunication apparatus in response to a noise level of a site in which the telecommunication apparatus is used, comprising the steps of:

detecting the noise level from audio signals produced consecutively in time by a microphone by evaluating average levels of said audio signals consecutively in time and by selecting the smallest of said average levels as data indicative of said noise level, wherein an amplitude of said audio signals is detected consecutively in time, data indicative of said amplitude is summed in an adder for a predetermined time interval and said adder is cleared in each said predetermined time interval for evaluating said average levels of said audio signals and wherein an output of said adder is latched at predetermined time intervals only when said output of said adder is smaller than data already latched; and controlling an audio output of said telecommunications apparatus in response to said noise level such that said audio output is increased when said noise level is increased and such that said audio output is decreased when said noise level is decreased.

7. A telecommunication apparatus, comprising:

a microphone for picking up a sound including speech and background noise, said microphone thereby producing audio input signals indicative of said sound consecutively in time;

a transmitter for transmitting said audio input signals in the form of an outgoing transmission signal;

a receiver for receiving an incoming transmission signal;

an audio level control circuit supplied with said incoming transmission signal for producing an audio output signal therefrom with a predetermined audio output level;

a loudspeaker for emitting said audio output signal in the form of a sound;

a noise level detector having an input connected to said microphone for detecting a background noise level from said audio input signals produced by said microphone; and noise level control circuitry supplied with said background noise level from said noise level detector for setting said predetermined audio output level of said audio level control circuit, wherein said noise level detector evaluates an average level of said audio input signals consecutively in time and selects the smallest of said average levels as said background noise level, and said noise level detector includes an amplitude detector supplied with said audio input signals consecutively in time for detecting an amplitude thereof, said amplitude detector producing amplitude data indicative of said amplitude of said audio input signals consecutively in time, and an adder supplied with said amplitude data consecutively in time for summing up said amplitude data supplied thereto, said adder producing sum data indicative of the result of said summing and being cleared periodically with a constant first time interval, a first register holding said sum data of said amplitude data produced by said adder, wherein the sum data from said adder is loaded to said first register at predetermined time intervals only when said sum data from said adder is smaller than said sum data already held by said first register.

8. A telecommunication apparatus, comprising:

a microphone for picking up a sound including speech and background noise, said microphone thereby producing audio input signals indicative of said sound consecutively in time;

a transmitter for transmitting said audio input signals in the form of an outgoing transmission signal;

a receiver for receiving an incoming transmission signal;

an audio level control circuit supplied with said incoming transmission signal for producing an audio output signal therefrom with a predetermined audio output level;

a loudspeaker for emitting said audio output signal in the form of a sound;

a noise level detector having an input connected to said microphone for detecting a background noise level from said audio input signals produced by said microphone; and noise level control circuitry supplied with said background noise level from said noise level detector for setting said predetermined audio output level of said audio level control circuit, wherein said noise level detector evaluates an average level of said audio input signals consecutively in time and selects the smallest of said average levels as said background noise level, and said noise level detector includes an amplitude detector supplied with said audio input signals consecutively in time for detecting an amplitude thereof, said amplitude detector producing amplitude data indicative of said amplitude of said audio input signals consecutively in time, an adder supplied with said amplitude data consecutively in time for summing up said amplitude data supplied thereto, said adder producing sum data indicative of the result of said summing and being cleared periodically with a constant first time interval, a first register holding said sum data of said amplitude data produced by said adder, a comparator for carrying out a comparison for comparing said sum data as produced by said adder and said sum data held in said first register, said comparator producing a logic control signal indicative of a result of said comparison, and a first load enable gate supplied with said logic control signal from said comparator for enabling a loading of said sum data from said adder to said first register only when said sum data as supplied from said adder is smaller than said sum data held in said first register.

9. A telecommunication apparatus, comprising:

a microphone for picking up a sound including speech and background noise, said microphone thereby producing audio input signals indicative of said sound consecutively in time;

a transmitter for transmitting said audio input signals in the form of an outgoing transmission signal;

a receiver for receiving an incoming transmission signal;

an audio level control circuit supplied with said incoming transmission signal for producing an audio output signal therefrom with a predetermined audio output level;

a loudspeaker for emitting said audio output signal in the form of a sound;

a noise level detector connected to said microphone for detecting a background noise level from said audio input signals produced by said microphone; and noise level control circuitry supplied with said background noise level from said noise level detector for setting said predetermined audio output level of said audio level control circuit, wherein said noise level detector evaluates an average level of said audio input signals consecutively in time and selects the smallest of said average levels as said background noise level, said noise level detector includes an amplitude detector supplied with said audio input signals consecutively in time for detecting an amplitude thereof, said amplitude detector producing amplitude data indicative of said amplitude of said audio input signals consecutively in time, an adder supplied with said amplitude data consecutively in time for summing up said amplitude data supplied thereto, said adder producing sum data indicative of the result of said summing and being cleared periodically with a constant first time interval, a first register holding said sum data of said amplitude data produced by said adder, a comparator for carrying out a comparison for comparing said sum data as produced by said adder and said sum data held in said first register, said comparator producing a logic control signal indicative of a result of said comparison, and a first load enable gate supplied with said logic control signal from said comparator for enabling a loading of said sum data from said adder to said first register only when said sum data as supplied from said adder is smaller than said sum data held in said first register, and said noise level control circuitry includes a second register holding said sum data in said first register and a second load enable gate enabling a loading of said sum data from said first register to said second register with a constant second time interval larger than said first time interval.

* * * * *